United States Patent
Khoshnood et al.

(10) Patent No.: US 9,413,519 B2
(45) Date of Patent: Aug. 9, 2016

(54) WIRELESS TRANSMISSION SYNCHRONIZATION USING A POWER LINE SIGNAL

(71) Applicant: Thomas & Betts International, LLC, Wilmington, DE (US)

(72) Inventors: Bahman Khoshnood, Boca Raton, FL (US); William J. Dodds, Hackettstown, NJ (US); Camilo Delgado, Long Island City, NY (US); Eugene Bright, Boca Raton, FL (US); David Ocasio, Orange Park, FL (US)

(73) Assignee: Thomas & Betts International, Inc. DE (US)

(*) Notice: Subject to any disclaimer, the term of this patent is extended or adjusted under 35 U.S.C. 154(b) by 0 days.

(21) Appl. No.: 14/681,337

(22) Filed: Apr. 8, 2015

(65) Prior Publication Data
US 2015/0295705 A1  Oct. 15, 2015

Related U.S. Application Data
(60) Provisional application No. 61/978,590, filed on Apr. 11, 2014.

(51) Int. Cl.
*H04L 7/00* (2006.01)
*G01R 31/08* (2006.01)
(Continued)

(52) U.S. Cl.
CPC .............. *H04L 7/0041* (2013.01); *G01R 31/08* (2013.01); *G08B 21/185* (2013.01);
(Continued)

(58) Field of Classification Search
CPC .. G01R 31/085; G01R 31/088; G01R 31/086; G01R 31/08; G01R 31/083; H02H 7/28; G01D 3/08; G04G 3/00; G04G 7/00; G06F 1/266; Y04S 10/522; Y04S 40/146; Y04S 40/123; H04L 7/0041; G08B 21/185; H04B 3/54; H02J 13/0051; Y02B 90/263; Y02E 60/7892

See application file for complete search history.

(56) References Cited

U.S. PATENT DOCUMENTS 3,781,665 A  12/1973  Gale
4,518,911 A   5/1985  Cass
(Continued)

FOREIGN PATENT DOCUMENTS

CA  2277001 A1  1/2000
CA  2636677 C   1/2009
(Continued)

OTHER PUBLICATIONS

Nordman M M et al: "Design of a Concept and a Wireless ASIC Sensor for Locating Earth Faults in Unearthed Electrical Distribution Networks", IEEE Transactions on Power Delivery, IEEE Service Center, New York, NY US, vol. 21, No. 3, Jul. 1, 2006, pp. 1074-1082, XP011148952, ISSN: 0885-8977, DOI: 10.1109/TPWRD.2006. 874637, pp. 1074-1077.

*Primary Examiner* — Vineeta Panwalkar
(74) *Attorney, Agent, or Firm* — Taft Stettinius & Hollister LLP

(57) ABSTRACT

A gateway may be configured to synchronize transmissions of a plurality of faulted circuit indicators (FCIs). The gateway may determine a time delay from a zero crossing of a power line signal and obtain network information from the at least one FCI from the plurality of FCIs. The gateway may identify a proximate FCI that is closest to a gateway based on at least one link parameter, and assign the determined time delay to the proximate FCI. The gateway may receive confirmations that at least one FCI received the determined time delay, and has synchronized transmissions based on the determined time delay and the zero crossings of the power signal.

25 Claims, 6 Drawing Sheets

(51) Int. Cl.
*H02J 13/00* (2006.01)
*G08B 21/18* (2006.01)
*H04B 3/54* (2006.01)

(52) U.S. Cl.
CPC ............. *H02J 13/0051* (2013.01); *H04B 3/54* (2013.01); *Y02B 90/263* (2013.01); *Y02E 60/7892* (2013.01); *Y04S 40/123* (2013.01); *Y04S 40/146* (2013.01)

(56) References Cited

U.S. PATENT DOCUMENTS

| | | |
|---|---|---|
| 4,570,231 A | 2/1986 | Bunch |
| 4,845,692 A | 7/1989 | Groslambert et al. |
| 4,851,782 A | 7/1989 | Jeerings et al. |
| 5,712,596 A | 1/1998 | Van Amesfoort |
| 5,905,758 A | 5/1999 | Schweiter, III et al. |
| 6,559,651 B1 | 5/2003 | Crick |
| 6,597,180 B1 | 7/2003 | Takaoka et al. |
| 6,798,211 B1 | 9/2004 | Rockwell et al. |
| 6,963,197 B1 | 11/2005 | Feight et al. |
| 7,034,604 B2 | 4/2006 | Minteer |
| 7,236,338 B2 | 6/2007 | Hale et al. |
| 7,272,201 B2 | 9/2007 | Whitehead et al. |
| 7,398,411 B2 | 7/2008 | Zweigle et al. |
| 7,746,241 B2 | 6/2010 | Feight et al. |
| 8,059,006 B2 | 11/2011 | Schweitzer, III et al. |
| 8,065,099 B2 | 11/2011 | Gibala et al. |
| 2004/0025496 A1 | 2/2004 | Patterson |
| 2006/0176631 A1* | 8/2006 | Cannon ................ H02H 1/0061 361/80 |
| 2007/0085693 A1 | 4/2007 | Feight |
| 2009/0222687 A1* | 9/2009 | Baker ................. H04L 41/0681 714/4.11 |
| 2009/0240449 A1 | 9/2009 | Gibala et al. |
| 2010/0238045 A1 | 9/2010 | Feight et al. |
| 2010/0301872 A1 | 12/2010 | Kereit et al. |
| 2012/0054527 A1 | 3/2012 | Pfeifer et al. |
| 2013/0064178 A1 | 3/2013 | Cs et al. |

FOREIGN PATENT DOCUMENTS

| | | |
|---|---|---|
| CA | 2703521 A1 | 5/2009 |
| CA | 2716582 A1 | 9/2009 |
| CA | 2793187 A1 | 9/2011 |
| CA | 2794964 A1 | 10/2011 |
| WO | 2008134998 A1 | 11/2008 |

* cited by examiner

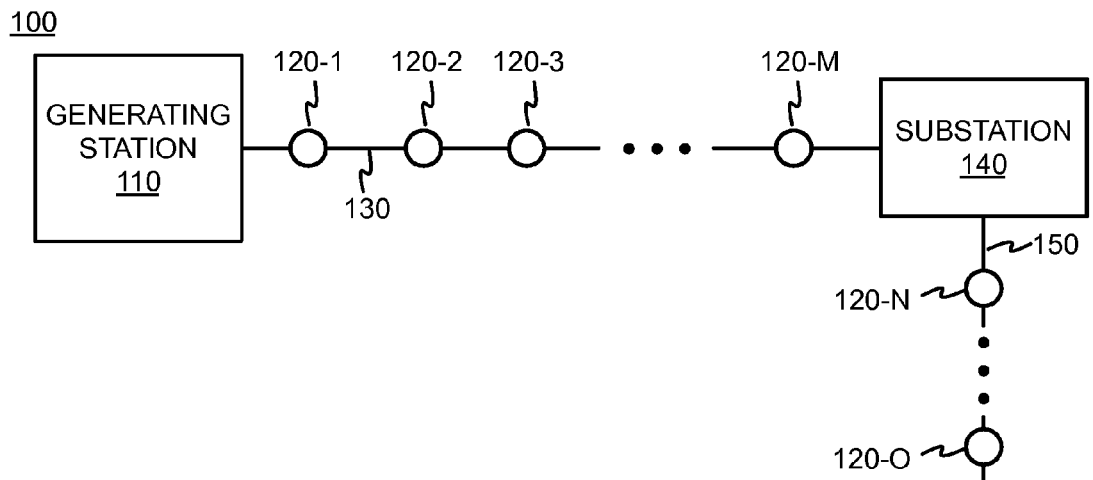
Fig. 1
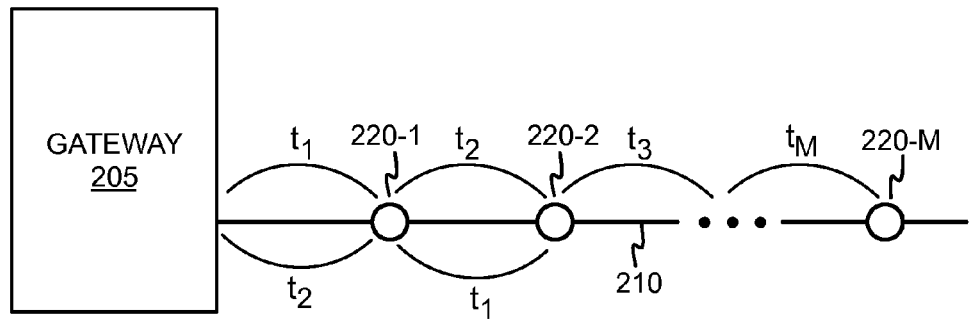
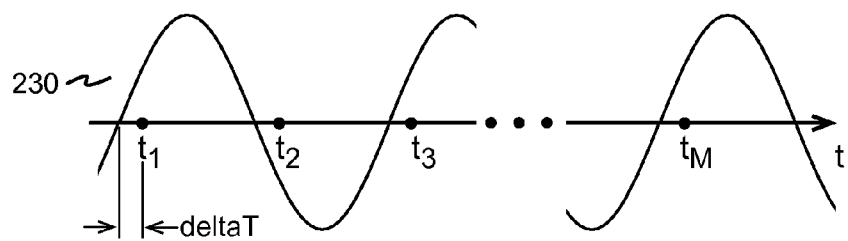
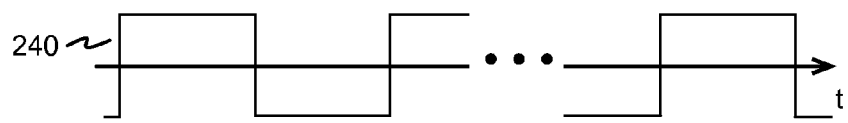
Fig. 2A

710

| ADDRESS NUMBER 715 | HOP COUNTER 720 | DIRECTION 725 | DIAG PARS/ COMMANDS 730 |
|---|---|---|---|

| ADDRESS NUMBER 715 | HOP COUNTER 720 | DIRECTION 725 | POWER LINE CONDITION 730 |
|---|---|---|---|

Fig. 7B

WIRELESS TRANSMISSION SYNCHRONIZATION USING A POWER LINE SIGNAL

CROSS-REFERENCE TO RELATED APPLICATION

This application claims priority under 35 U.S.C. §119 based on U.S. Provisional Patent Application No. 61/978,590 filed Apr. 11, 2014, the disclosure of which is hereby incorporated by reference herein.

BACKGROUND OF THE INVENTION

Faulted circuit indicators (FCIs) may be attached to power lines and used to detect electrical faults in power distribution systems. The FCI may detect anomalies in the current and/or voltage of the power line signal, and provide an indication of fault to technicians working to isolate the location of a malfunction in the power distribution system. The indication of a detected fault may be provided, for example, in a visual manner using a mechanical indicator (e.g., a "flag") and/or a blinking Light Emitting Diode (LED). However, a technician may require a clear line of sight and a close proximity to the FCI in order to reliably observe the visual fault detection indicators "in the field."

After the problem in the power distribution system has been isolated and resolved, some FCIs may have their fault detection indicators manually reset before they may continue to monitor the power line. Resettable FCIs, which may automatically reset the fault detection indicator after a predetermined period of time, can alleviate the work of manually resetting FCIs. However, in some instances, resettable FCIs may clear the fault indication prior to it being observed by the technician, thus complicating the trouble-shooting process.

Accordingly, modern FCIs having wireless communication capabilities have been developed to quickly report the indication of a detected fault to a remote station without the having to be observed in the field by a technician. However, various aspects of wireless communication may stress the on-board power supply of an FCI. For example, synchronizing the transmissions of multiple FCIs along a power line can be time-consuming and may draw a disproportionate amount of on-board power, thus potentially shortening the life span of the FCI.

BRIEF DESCRIPTION OF THE DRAWINGS

FIG. 1 is an illustration of an exemplary environment implementing faulted circuit indicators (FCIs) which use a power line signal to synchronize transmissions;

FIGS. 2A and 2B are a diagram showing exemplary transmission schemes for FCIs using the power line signal to synchronize transmissions;

FIGS. 7A and 7B are diagrams depicting exemplary message formats for communications between a gateway and FCIs.

DETAILED DESCRIPTION OF EMBODIMENTS

Figure 2B:
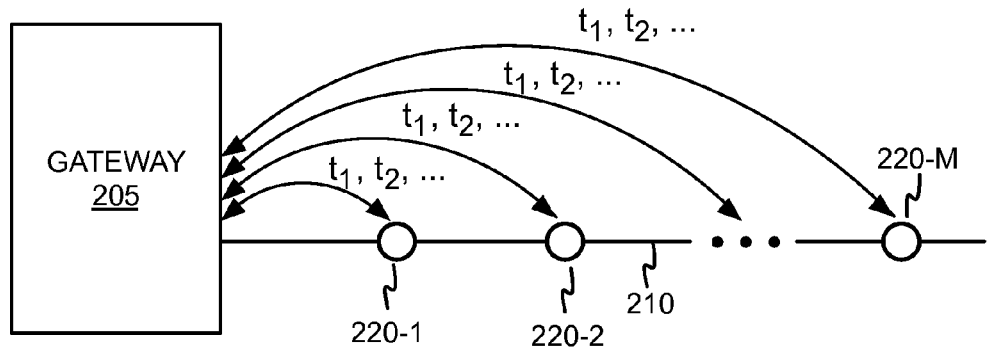

The following detailed description refers to the accompanying drawings. The same reference numbers in different drawings may identify the same or similar elements.

Embodiments described herein are directed to faulted circuit indicators (FCIs) that may synchronize transmissions based upon the alternative current (AC) oscillation frequency of the power line signal being monitored. Specifically, each of the FCIs may be configured to simultaneously transmit at a time that corresponds to a predefined time delay from a zero crossing of the power line signal, e.g., the time at which the voltage of the AC signal crosses from positive to negative or vice-versa. The predefined time delay may be determined so as to reduce interference of the FCI transmissions that are caused by the power line signal, to eliminate potential collisions with other FCI transmissions, as well as to optimize the power consumption by setting the timing of the message transmissions. The synchronization of the FCI transmission may be initiated by an external gateway, which also monitors the power line signal. The gateway may provide the benefit of making it unnecessary to have each FCI go through the power intensive process of synchronizing with each other using internally generated clock signals, thus reducing power consumption of each FCI's internal power source. Moreover, further power savings may be realized by having each FCI use the power signal itself as the transmission timing reference during normal operation. Using the power line signal as the transmission time reference instead of an internally generated clock signal may further reduce energy consumption of each FCI's internal power source. An internally generated clock signal may be substituted if a power line fault occurs and renders the power signal unavailable, where the internally generated signal is synchronized to the power line signal.

FIG. 1 is an illustration of an exemplary power distribution environment 100 implementing faulted circuit indicators (FCIs) that synchronize transmissions based on a power line signal. Power distribution environment 100 may include a generating station 110, a plurality of FCIs 120 (herein referred to collectively as "FCIs 120" and individually as FCI 120-$x$"), a transmission line 130, a substation 140, and a distribution line 150. Power distribution environment 100 may be part of a larger power distribution system, and may include additional or different entities in alternative configurations than which are exemplified in FIG. 1.

Generating station 110 may transmit power on transmission lines 130 over long distances, which may terminate substation 140. High voltages, e.g., 765 kV, may be employed in transmission lines 130 to improve efficiencies of the delivery of electric power. Accordingly, for safety reasons, transmission lines 130 may be suspended high off the ground using transmission towers. FCIs 120-1 through 120-M may be mounted directly on transmission lines 130 using spacing consistent with conventional power monitoring systems, and at distances which permit radio communications at least between adjacent FCIs 120. While the spacing shown in FIG. 1 between FCIs 120 appears to be the same, the lengths between adjacent FCIs 120 do not have to be the equidistant. Given the height of transmission lines 130 and the magnitude of the voltages being transferred, access to FCIs 120-1 through 120-M for maintenance, such as battery replacement, can be difficult and hazardous. As such, it can be desirable so minimize the maintenance each FCI 120 requires. Transmission lines 130 may terminate at substation 140, which may step-down the high voltage provided over transmission lines 130 for distribution to various classes of customers, such as, for example, sub-transmission customers, primary customers, and/or secondary customers (such as, for example, homes and small businesses). Distribution lines 150 leading from substation 140 may also be monitored with a plurality of FCIs 120-N through 120-O, which may be suspended directly from distribution lines 150. As used herein, the term "power line" may be used to designate any type of conducting line used to transmit power. Accordingly, both transmission line 130 and distribution line 150 may be referred to as "power lines."

FCIs 120 may be used to locate earth-faults or short-circuits in a power distribution system. Each of FCIs 120 may constantly monitor the power line for earth-fault and/or short-circuit conditions. As soon as a fault current higher than the trip value is detected, the fault will be indicated. To avoid false indications, FCIs 120 may sample and analyze the measured fault signal using a microcontroller, as will be explained in more detail in relation to FIG. 4. As will be discussed in more detail in regards to FIGS. 2A and 2B, FCIs 120 may wirelessly communicate with each other and/or at least one gateway device to provide fault indications to a centralized location, such as generating station 110. Accordingly, FCIs 120 may be reliable and cost efficient given fault indications are provided over wireless channels, since there are no mechanical fault indicators requiring physical contact by a technician to be reset. Moreover, reporting fault indications over a wireless channel obviates the need for a technician to be within a close proximity to observe a visual fault indication such as flag or an LED.

FIG. 2A is a diagram showing an exemplary power distribution system 200 where FCIs may use a power line signal to synchronize transmissions. Power system 200 may include a gateway 205, power line 210, and FCIs 220 (herein referred to collectively as "FCIs 220" and individually as FCI 220-M"). Gateway 205 may be coupled to power line 210 to analyze the power line signal and also communicate wirelessly with FCIs 220. FCIs 220 may be coupled to power line 210 to monitor for faults as described above for FCIs 120 in relation to FIG. 1. Gateway 205 may reside in generating station 110 and/or substation 140, depending upon the configuration of the FCIs 220. Additionally, power line 210 may correspond to transmission line 130 and/or distribution line 150 shown in FIG. 1.

In some embodiments, one or more transformers may be positioned within the path of one or more of the FCIs 220. In this case, the FCI 220 positioned immediately before or after the transformer can detect the signal shift and report the signal shift to the gateway 205. In response, gateway 205 may adjust the timing of other FCIs based on detecting the transformer and frequency shift for the rest of the FCIs. This will be repeated upon detecting any other transformers in the transmission path.

Gateway 205 may synchronize the transmission of FCIs 220 and thus determine when the FCIs 220 transmit fault indications and/or other messages such as status information. Gateway 205 may use the zero crossings of the power line signal as a frequency reference for performing transmission synchronization. The frequency of the power line signal may be, for example, 50 or 60 Hz. FIG. 2A illustrates a graph of a power line signal 230 as a function of time.

During an initialization period, gateway 205 may detect the presence of all FCIs 220 in its mesh using a standard communication protocol and timings such as multicast. Further, gateway 205 may be equipped with an algorithm to identify all FCIs 220 and their relative RF positions with respect to each other, the presence or absence of transformers and may use this information in its synchronization and delay calculation routine. In particular, gateway 205 may synchronize with the zero crossing of power line signal 230 using known techniques, examples of which will be discussed in more detail in reference to FIG. 3. Gateway 205 may also determine a time delay from the zero crossing (as shown deltaT in FIG. 2A) to derive optimal transmission times for all FCIs 220. The time delay may be selected in order to reduce the interference between power line signal 230 and the transmission/reception of FCIs 220. Specifically, given the close proximity between FCIs 220 and power line 210, corona and/or magnetic field effects of the high voltage power line signal 230 can have negative impacts on the wireless channels used by FCIs 220. The time delay may be chosen using known techniques to mitigate the interference effects. Further during the initialization period, gateway 205 may provide and/or detect each FCI 220 address number, and then will assign the transmission times to each FCI 220. Further details of the initialization procedure are described below in relation to FIG. 5.

After the initialization period, once the transmission time for FCIs 220 have been determined and gateway 205 has the addressing and/or other information to establish a network for communicating with the FCIs 220, normal monitoring operations may commence.

Consistent with some embodiments described herein, communications between gateway 205 and each FCI 220 may be performed using a unicast multi-hop approach where each FCI 220 transmits simultaneously at the time specified by gateway 205 to a neighboring FCI 220. Using a multi-hop approach, as illustrated in FIG. 2A, may reduce the transmitting ranges for each FCIs 220, and thus may save power for each FCI 220 during normal operation. For example, gateway 205 may send a command in the form of a packet to FCI 220-M by initially transmitting the packet to FCI 220-1 at designated transmission time $t_1$. FCI 220-1, upon reading the address of the packet (which is uniquely addressed to FCI 220-M), may pass the packet along to FCI 220-2 at the next transmission time $t_2$. During each transmission time $t_i$, the packet may "hop" along each FCI 220 in the path until it arrives at FCI-220-M at transmission time $t_M$.

Additionally, packets from the FCIs 220 may be simultaneously passed back to gateway 205 during the above noted transmission times. For example, at time $t_1$, FCI 220-2 may send a packet towards gateway 205, wherein the packet may include power line condition information (e.g., a fault indication). The packet may first be transmitted from FCI 220-2 to FCI 220-1 at time $t_1$, and then passed from FCI 220-1 to gateway 205 at time $t_2$. Simultaneously transmitting in both directions may be accomplished by having FCIs 220 operate in a full duplex mode, where each direction may be uniquely modulated to prevent interference. For example, each FCI 220 may simultaneously transmit packets in both directions during each transmission time ti, by using, for example, frequency division multiplexing and/or code division multiplexing. By simultaneously transmitting in both directions, the efficiency of the wireless communications is more efficient, which can result in additional power savings.

Further referring to FIG. 2A, when the power line signal 230 is present, it may be used as the ongoing transmission synchronization reference for gateway 205 and FCIs 220, as indicated by the time designations $t_1, \ldots, t_M$ on power line signal 230. Using the power signal 230 itself, instead of an internally generated clock signal, may reduce power consumption for each FCI 220. However, during a fault, power line signal 230 may no longer be present. In such an event, each FCI 220 may synchronize transmissions using an internally generated clock signal 240. The internally generated clock signal may be synchronized based on the last prior transmission time and the frequency of the power line signal (e.g., 60 Hz, 50 Hz, etc.).

FIG. 2B is a diagram showing power distribution system 250 consistent with embodiments described herein. In contrast to system 200 described above, the FCIs 220 in power system 250 are configured to have sufficient transmitting power to wirelessly communicate directly with gateway 205 (e.g., over the air) during each transmission time $t_i$. Accordingly, potential delays introduced by the multi-hop approach discussed above may be ameliorated at the cost of increased operating power.

Power distribution environment 120, as described above in relation to FIG. 1, is provided in the context where power lines may be suspended in the air from transmission towers. In such an environment, the wireless channel used to communicate between gateway 205 and FCIs 220 may be supported by a suitable physical layer, which may include any known wireless frequencies, modulations, and protocols. For example, the wireless communications may be implemented with suitable carriers, and may include protocols consistent with local area networks (e.g., WiFi 802.11x, Bluetooth®, IrDA, etc.), and/or protocols consistent with wide area networks (e.g., WiMAX and/or cellular protocols including, for example GPRS, 3G, 4G, HSxPA, HSPA+, LTE, etc.). In alternative embodiments, various wired or fiber optic-based transmission media may be used to support communications between FCIs 220 and gateway 205.

Embodiments provided herein are not limited to environments where power line 210 are suspended from transmission towers, and thus may be employed in various different scenarios and environments. For example, in some embodiments, power line 210 may be installed underground. Here, gateway 205 may be above ground, and each FCI 220 may be buried and in contact with power line 210. The FCIs 220 may transmit on center frequencies that are low enough to sufficiently propagate through the earth so they can communicate with each other and gateway 205. In other embodiments, power line 210 may be an underwater power line, where both power line 210 and FCI 220 are may be submerged under water at significant depths. In such a case, FCIs 220 may communicate using different propagation techniques having much different wavelength, such as, for example, using sound waves carriers and/or low frequency electromagnetic carriers.

Figure 3:
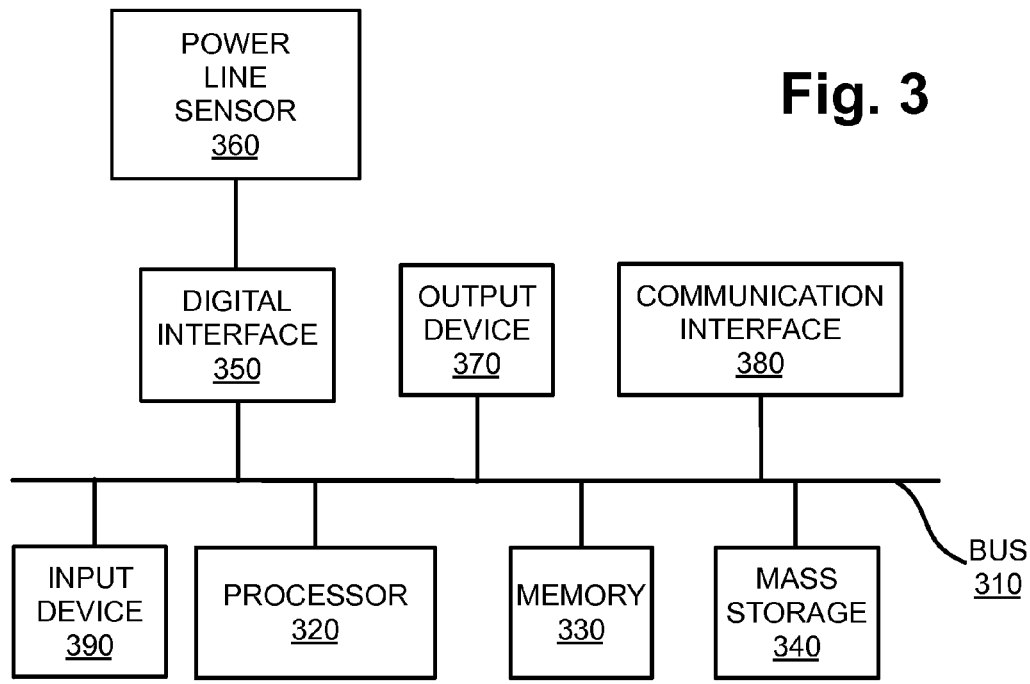
FIG. 3 is a block diagram illustrating exemplary components for a gateway according to an embodiment.

FIG. 3 is a block diagram illustrating exemplary components for a gateway 205 according to an embodiment. Gateway 205 may be a server or an industrial controller such as a SCADA (Supervisory Control and Data Acquisition) unit, which may be commonly used in power generation applications. Gateway 205 may include a bus 310, a processor 320, a memory 330, mass storage 340, an input device 390, an output device 370, a communication interface 380, and a power line sensor 360 which may be coupled to a digital interface 350.

Bus 310 includes a path that permits communication among the components of gateway 205. Processor 320 may include any type of single-core processor, multi-core processor, microprocessor, latch-based processor, and/or processing logic (or families of processors, microprocessors, and/or processing logics) that interprets and executes instructions. In other embodiments, processor 320 may include an application-specific integrated circuit (ASIC), a field-programmable gate array (FPGA), and/or another type of integrated circuit or processing logic. For example, the processor 320 may be an x86 based CPU, and may use any operating system, which may include varieties of the Windows, UNIX, and/or Linux. The processor 320 may also use high-level analysis software packages and/or custom software written in any programming and/or scripting languages for interacting with other FCIs 220 and other devices.

Memory 330 may include any type of dynamic storage device that may store information and/or instructions, for execution by processor 320, and/or any type of non-volatile storage device that may store information for use by processor 320. For example, memory 330 may include a RAM or another type of dynamic storage device, a ROM device or another type of static storage device, and/or a removable form of memory, such as a flash memory. Mass storage device 340 may include any type of on-board device suitable for storing large amounts of data, and may include one or more hard drives, solid state drives, and/or various types of RAID arrays. Mass storage device 340 would be suitable for storing files associated applications for sensing power line signals and synchronizing transmission with FCIs 220.

Communication interface 380 may include a wired and/or wireless interfaces to communicate with other devices and/or FCIs 220. For example, SCADA commands to configure gateway 205 may be received over a wired interface. Additionally, communications with FCIs 220 would be wireless, where the type of wireless channel may depend on the environment were the FCIs 220 are operating. In an embodiment, where FCIs are coupled to power lines 210 suspended from transmission towers, communications interface 270 may be based on any suitable wireless communication, in including wireless local area networking (e.g., RF, infrared, and/or visual optics, etc.) and/or wireless wide area networking (e.g., WiMaxx, cellular technologies including GPRS, 3G, HSxPA, HSPA+, LTE, etc.). Communication interface 380 may include a transmitter that converts baseband signals to RF signals and/or a receiver that converts RF signals to baseband signals. Communication interface 380 may be coupled to one or more antennas for transmitting and receiving RF signals. Communication interface 380 may include a logical component that includes input and/or output ports, input and/or output systems, and/or other input and output components that facilitate the transmission/reception of data to/from other devices. For example, communication interface 380 may include a network interface card (e.g., Ethernet card) for wired communications and/or a wireless network interface (e.g., a WiFi) card for wireless communications. Communication interface 380 may also include a USB port for communications over a cable, a Bluetooth® wireless interface, and/or any other type of interface that converts data from one form to another form. In other environments, communications interface 380 may rely on wireless communications based low frequency electromagnetic carriers and/or acoustic carriers (for penetrating ground and/or water), and have the appropriate hardware and transducers for transmitting and receiving over a range of frequencies and/or waveform types (electromagnetic and/or acoustic).

Power line sensor 360 may be used to sense power signal 230 from power line 210. In an embodiment, power line sensor 360 may use an inductive coupling to generate a sensing signal representative of the power line signal 230. The sensing signal may be provided to a digital interface 350 so it may be sampled and digitized for use by processor 320 for analysis. In some embodiments, power line sensor 360 and digital interface 350 may be combined into a signal unit. During an initialization period, gateway 205 may detect and synchronize with the zero crossing of power line signal 230. The zero crossing may be determined by processor 320 by sampling the sensing signal using a relatively high sampling frequency relative to the Nyquist frequency. By detecting sign changes in the sensing signal, microprocessor may accurately determine the zero crossings for synchronization. Higher accuracies may be obtained using an appropriate interpolation and/or root finding algorithm to find a zero crossing.

Such algorithms may be performed in an ongoing manner, or only periodically since the nominal frequency of the power line signal is known, and processor 320 may only track small variations in frequency, assuming the power line signal is relatively stable. Alternatively, digital phase lock loops may be implemented in software and be used to synchronize and track the zero crossings of the sensing signal.

Input device 390, which may be optional, can allow an operator to input information into administration gateway 205, if required. Input device 390 may include, for example, a keyboard, a mouse, a pen, a microphone, a remote control, an audio capture device, an image and/or video capture device, a touch-screen display, and/or another type of input device. In some embodiments, gateway 205 may be managed remotely and may not include input device 390.

Output device 370 may output information to an operator of gateway 205, and can include a display (such as an LCD), a printer, a speaker, and/or another type of output device. In some embodiments, gateway 205 may be managed remotely and may not include output device 260.

As described below in relation to FIG. 5, gateway 205 may perform certain operations relating to establishing synchronization between FCIs 220 and communicating with FCIs in an ongoing manner. Gateway 205 may perform these operations in response to processor 320 executing software instructions contained in a computer-readable medium, such as memory 330 and/or mass storage 340. The software instructions may be read into memory 330 from another computer-readable medium or from another device. The software instructions contained in memory 330 may cause processor 320 to perform processes described herein. Alternatively, hardwired circuitry may be used in place of, or in combination with, software instructions to implement processes described herein. Thus, implementations described herein are not limited to any specific combination of hardware circuitry and software.

Although FIG. 3 shows exemplary components of gateway 205, in other implementations, gateway 205 may include fewer components, different components, additional components, or differently arranged components than depicted in FIG. 3.

Figure 4:
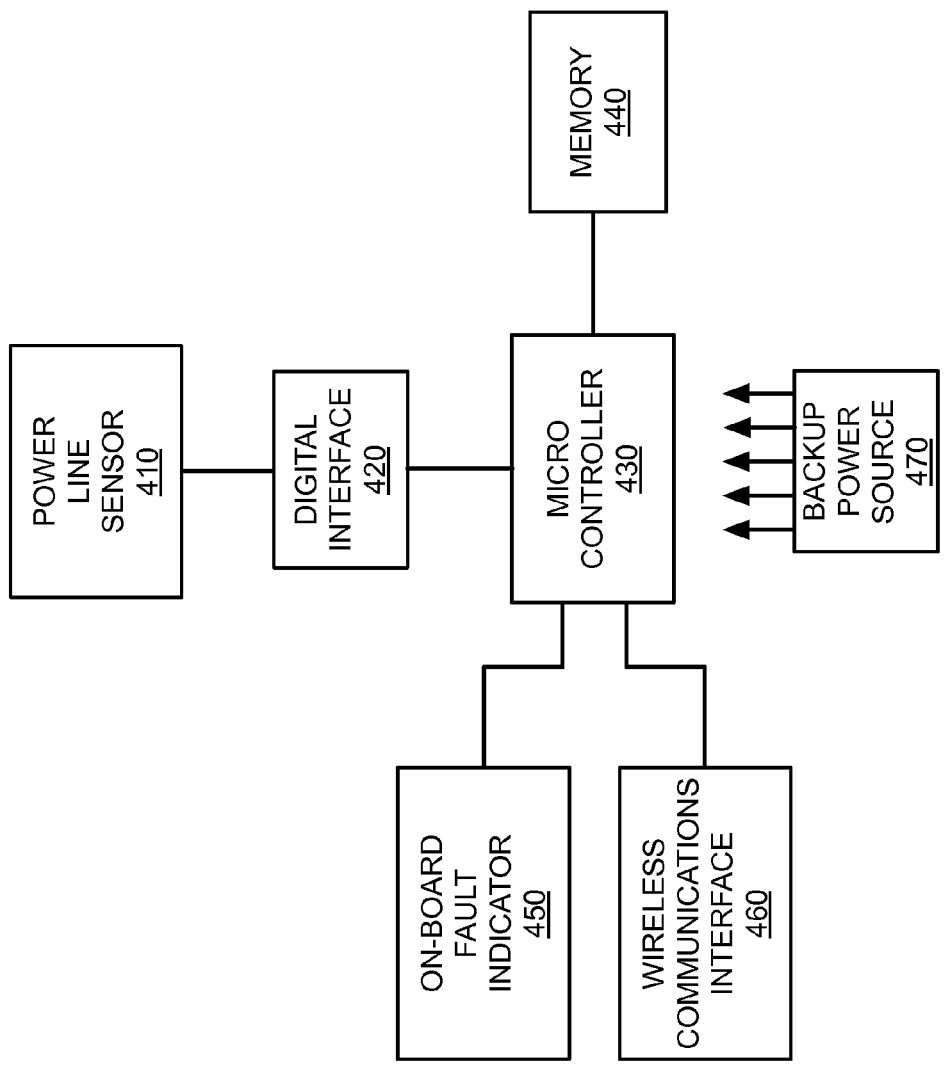
FIG. 4 is a block diagram depicting exemplary components for an FCI according to an embodiment.

FIG. 4 is a block diagram depicting exemplary components for an FCI 220 according to an embodiment. FCI 220 may include a microcontroller 430, memory 440, a power line sensor 410, a digital interface 420, a wireless communication interface 460, an on-board fault indicator 450, and a backup power source 470.

Microcontroller 430 may include a processor, microprocessor, or processing logic that may interpret and execute instructions. Alternatively, microcontroller 430 may include dedicated hardware, such as an ASIC, for performing logical and/or mathematical operations. Microcontroller 430 may interface to other components using a bus (not shown) or through other interfaces which may be dedicated to particular on-board devices. Memory 320 may include a random access memory (RAM), read only memory (ROM), and/or any other type of storage device that may store information and instructions for execution by microcontroller 430. Memory 440 may be integrated with microcontroller 430 in a common package, or may be housed externally, or a combination thereof.

Power line sensor 410 may be used to sense power signal 230 from power line 210. In an embodiment, power line sensor 410 may use an inductive coupling to generate a sensing signal representative of the power line signal 230 for transmission synchronization and fault detection. Other devices, used on conventional FCIs, may be additionally used for power line fault detection, and may include, for example, reed switches. The sensing signal may be provided to a digital interface 420 so it may be sampled and digitized for use by microcontroller 430 for analysis. In some embodiments, power line sensor 410 and digital interface 420 may be combined into a signal unit. Using the sensing signal provided by power line sensor 410, FCI 220 may detect and synchronize with the zero crossing of power line signal 230. The zero crossing may be determined by microcontroller 430 by sampling the sensing signal using a relatively high sampling frequency relative to the Nyquist frequency. By detecting sign changes in the sensing signal, microprocessor may accurately determine the zero crossings for synchronization. As noted above, higher accuracies may be obtained using an appropriate interpolation and/or root finding algorithm to find a zero crossing. Such algorithms may be performed in an ongoing manner, or only periodically since the nominal frequency of the power line signal is known, and microcontroller 430 may only need to track small variations in frequency, assuming the power line signal frequency is relatively stable. Alternatively or additionally, microcontroller 430 may use digital phase lock loops implemented in software for establishing and maintaining synchronization with the power line signal. Once synchronized, FCI 220 may use the time delay deltaT provided by gateway 205 to determine the transmission times.

Wireless communication interface 460 may communicate with other FCIs 220 and/or directly with gateway 205 over one or more wireless channels. As noted in the description relating to FIG. 2, FCIs 220 may operate in full duplex mode, thus having multiple channels that use frequency division multiplexing and/or code division multiplexing, for example, to avoid cross talk interference. The type of wireless channel may depend on the environment in which FCIs 220 are operating. In an embodiment, where FCIs 220 are coupled to power lines 210 which are suspended from transmission towers, communications interface 270 may be based on any suitable wireless communication, in including wireless local area networking (e.g., RF, infrared, and/or visual optics, etc.) and/or wireless wide area networking (e.g., WiMaxx, cellular technologies including GPRS, 3G, HSxPA, HSPA+, LTE, etc.). Wireless communication interface 460 may include a transmitter that converts baseband signals to RF signals and/or a receiver that converts RF signals to baseband signals. Wireless communication interface 460 may be coupled to one or more antennas for transmitting and receiving RF signals. In other environments, wireless communications interface 460 may rely on wireless communications based low frequency electromagnetic carriers and/or acoustic carriers (for penetrating ground and/or water), and have the appropriate hardware and transducers for transmitting and receiving over a range of frequencies and/or waveform types (electromagnetic and/or acoustic).

On-board fault indicator 450 may include conventional fault indicators, such as, for example, electromagnetically triggered flags and/or LED indicators. Having conventional indictors in addition to those provided over the wireless channels may be useful when technicians are trouble-shooting the power distribution system in the field.

For example, consistent with embodiments described herein, on-board fault indicator 450 may include a fiber optic interface (or similar light transmitting interface) to facilitate remote observation of fault events. For example, FCIs 220 may include an LED indicator as an on-board fault indicator 450 that illuminates when there is a fault. A fiber optic cable may be positioned in proximity to the LED and routed to an observation point, such that light emitted from the device can be observed remotely, e.g., by an operator or light sensor. Such an embodiment is particularly useful when an FCI 220 is mounted underground, in a sealed enclosure, or not easily accessible, e.g., buried under a concrete pad.

Backup power source 470 may be used to power the other components in FCI 220 when no power line signal is present, or as an additional source of power if needed. FCI 220 may inductively draw power from power line 210 during normal operations, which may power the initial components and also, in some implementations, charge backup power source 470. The backup power source may include one or more types of rechargeable or non-rechargeable energy storage devices (e.g., batteries).

FCIs 220 may perform certain operations or processes, as may be described below in relation to FIG. 6. FCI 220 may perform these operations in response to microcontroller 430 executing software instructions contained in a computer-readable medium, such as memory 440. A computer-readable medium may be defined as a physical or logical memory device. A logical memory device may include memory space within a single physical memory device or spread across multiple physical memory devices. The software instructions may be read into memory 440 from another computer-readable medium or from another device via communication interface 460. The software instructions contained in memory 440 may cause microcontroller 430 to perform operations or processes that will be described in detail with respect to FIG. 6. Alternatively, hardwired circuitry may be used in place of or in combination with software instructions to implement processes consistent with the principles of the embodiments. Thus, exemplary implementations are not limited to any specific combination of hardware circuitry and software.

The configuration of components of FCI 220 illustrated in FIG. 4 is for illustrative purposes only. It should be understood that other configurations may be implemented. Therefore, FCI 220 may include additional, fewer and/or different components than those depicted in FIG. 4.

Figure 5:
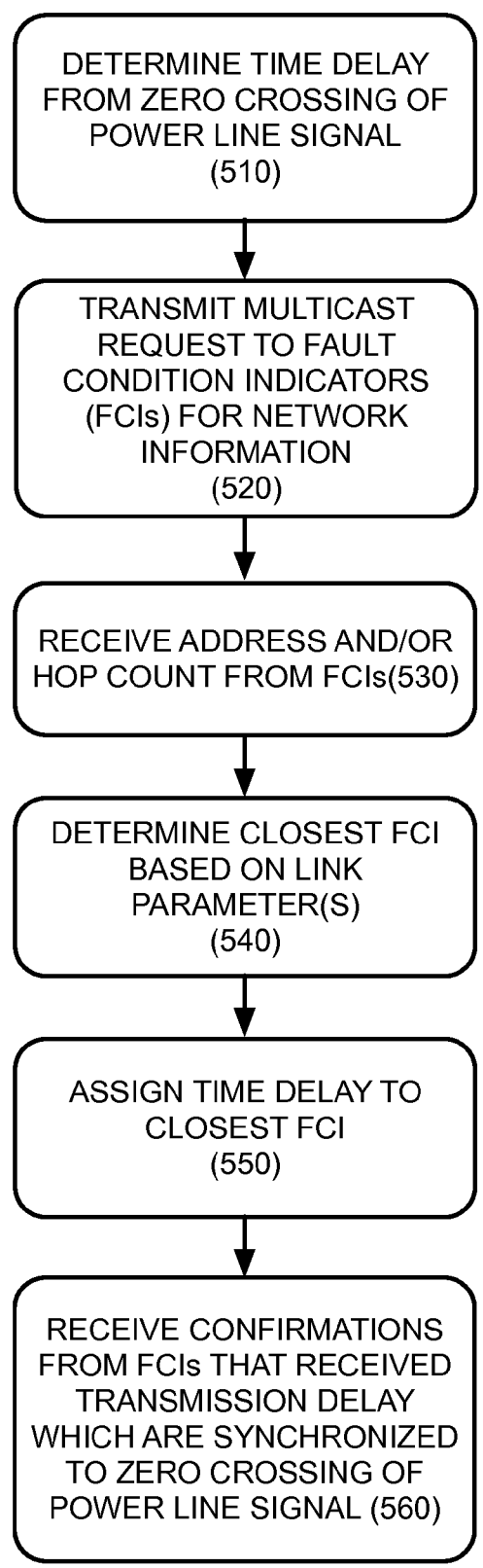
FIG. 5 is a flow chart showing an exemplary process of a gateway initializing transmission synchronization for FCIs based on a power line signal.

FIG. 5 is a flow chart showing an exemplary process of gateway 205 initializing transmission synchronization for FCIs 220 based on a power line signal. Gateway 205 may initially determine the time delay (deltaT shown in FIG. 2) from a zero crossing of a power line signal (Block 510). The time delay may be calculated to reduce interference, which is caused by the power line signal, with FCIs 220 transmissions. The time delay may be determined by first ascertaining the phase angle which reduces the corona and magnetic field of the power line signal. The phase angle may be constant for a given power line topology. The phase angle may then be converted to a time delay (deltaT) from a zero crossing of the power line signal.

Gateway 205 may then obtain network information from one or more FCIs 220 coupled to power line 210. This may include having gateway 205 transmit a multicast request to FCIs 220 for an address and a hop count (Block 520). Consistent with embodiments described herein the hop count include a value indicative of a physical distance between gateway 205 and respective FCIs 220. For example, in environment in which each FCI is separated by one mile of transmission line, an FCI with a hop count of five is known to be five miles from gateway 205. Gateway 205 may then receive the address and the hop count from one or more of FCIs 220 in response to the multicast request (Block 530). In an embodiment, the multicast request to the FCIs 220 may transition one or more of the FCIs 220 from a power savings state to an active state.

Gateway 205 may identify a proximate FCI, which is closest to gateway 205 based on at least one link parameter (Block 540). The link parameter may be function of the wireless signal received from the FCIs 220, and may include determining the nearest FCI 220 based on signal strength and/or time delays. Once gateway 205 determines the closest FCI 220, gateway 205 may assign the determined time delay (deltaT) to the proximate FCI (Block 550).

Gateway 205 may then receive confirmations that one or more FCIs 220 received the determined time delay, and were able to synchronize transmissions based on the determined time delay and the zero crossings of the power line signal (Block 560).

Figure 6:
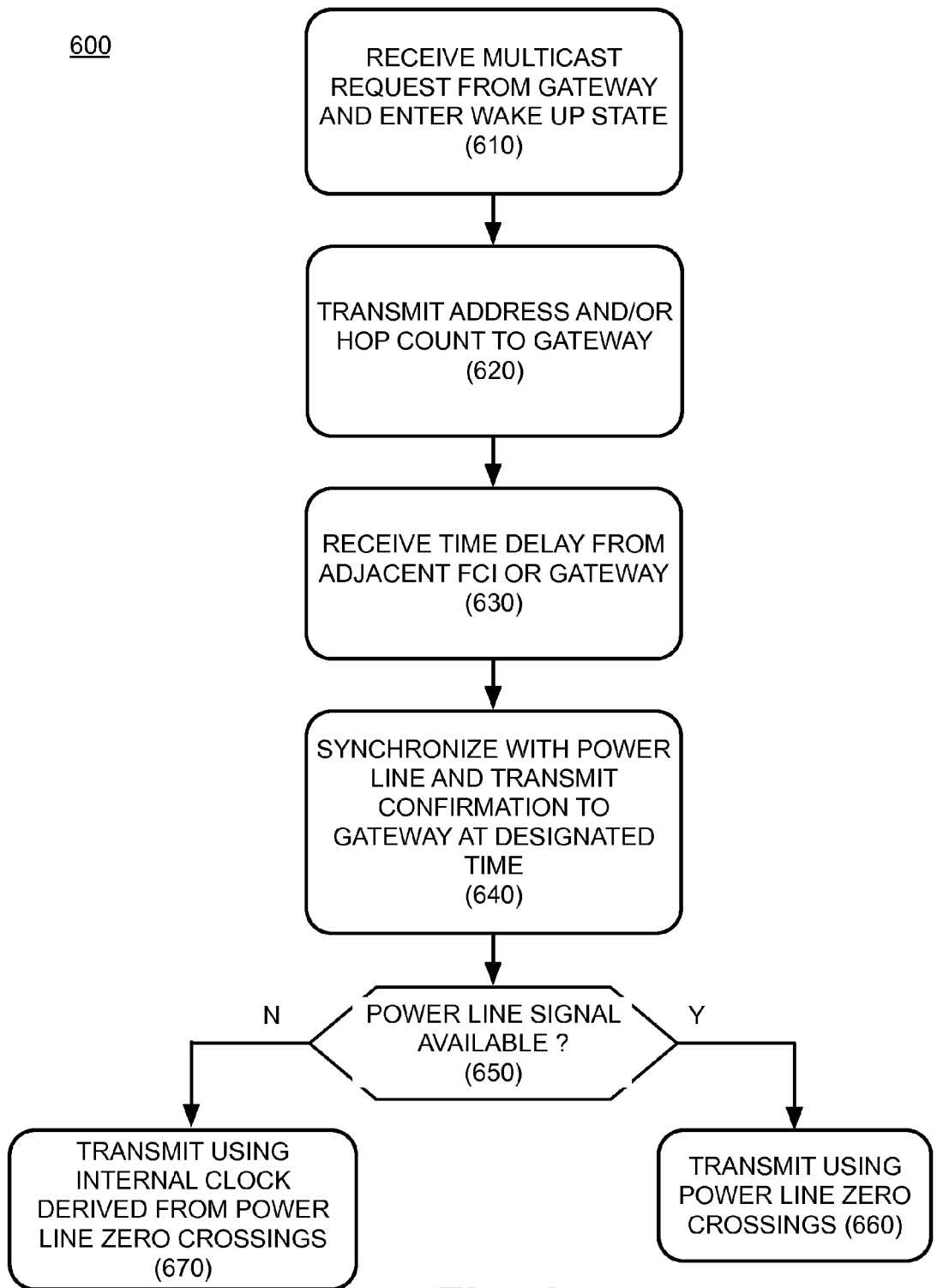
FIG. 6 is a flow chart illustrating an exemplary process of an FCI initializing transmission synchronization based on a power line signal.

FIG. 6 is a flow chart illustrating an exemplary process of FCI 220 initializing transmission synchronization based on a power line signal. FCI 220 may initially receive a request for network information from gateway 205 (Block 610). The request may be a multicast request. If FCI 220 was in a sleep state when the request was received, then FCI 220 will transition to wake state.

FCI 220 may transmit network information in response to the received request. The network information may include an address identifying the FCI 220 and a hop count from gateway 205. A proximate FCI 220-1, which is closest to gateway 205, may then receive a time delay (deltaT) (Block 630). FCI 220-1 may transmit the time delay to adjacent FCIs, which will in turn do the same until all FCIs 220 have received the time delay (Block 630). In an alternative embodiment, such as described above with respect to FIG. 2B, all FCIs 220 associated with a particular gateway 205 may receive the time delay (deltaT) directly from gateway 205. The FCIs 220, by monitoring the power line signal 230, may synchronize their transmissions according to the received time delay and a frequency based on zero crossings of a power line signal (Block 640). Afterwards, FCIs 220 may transmit a confirmation to gateway 205 that the time delay was received and the transmissions are synchronized based on the received time delay and the zero crossings of the power line signal.

Once synchronized, each FCI 220 may monitor and simultaneously transmit fault condition information over the synchronized transmissions. In one embodiment, the FCIs 220 may transmit the fault condition information to gateway 205 using a multi-hop approach (i.e., through one or more FCIs 220) as shown and discussed in relation to FIG. 2A, while in other implementations, each FCI 220 may transmit fault condition information to gateway 205 directly, such as shown in described above in relation to FIG. 2B.

Additionally, in order to maintain synchronized transmissions during a power line fault, the FCIs 220 may test whether the power line signal is available (Block 650). The FCIs 220 may transmit the fault condition information at a frequency based on the zero crossings derived directly from the power line signal when the power line signal is available (Block 660). Alternatively, when FCI 220 determines that the power line signal is not available, the FCI 220 may generate an internal clock signal based on the received time delay and the zero crossings of the power line signal, and transmit the fault condition information at a frequency derived from the internal clock signal (Block 670).

FIG. 7A and FIG. 7B are diagrams depicting exemplary message formats for communications between gateway 205 and FCIs 220. FIG. 7A shows an exemplary message format 710 which may be included in a packet transmitted by gateway 205. Message format 710 may include an address number identifying a destination FCI (e.g., FCI 220-M shown in FIG. 2), a hop counter 720 tracking the number of hops encountered in the transmission, a direction 725 indicating which way the packet traveled from the gateway, and data parameters (e.g., deltaT) or commands 730 issued to the destination FCI 220-M.

FIG. 7B shows an exemplary message format 750 which may be included in a packet transmitted by FCI 220. Message format 715 may include an address number identifying gateway 205 (especially useful if more than one gateway is employed along power line), a hop counter 720 tracking the number of hops encountered in the transmission, a direction 725 indicating which way the packet traveled from the gateway, and fault indicator which may be a code indicating the condition of the power line signal (e.g., whether a fault exists and/or descriptive information regarding the type of fault).

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, while the series of blocks have been described with rear dot FIGS. 5 and 6, the order of blocks may be modified in other embodiments. Further, non-dependent blocks may be performed in parallel.

Certain features described above may be implemented as "logic" or a "unit" that performs one or more functions. This logic or unit may include hardware, such as one or more processors, microprocessors, application specific integrated circuits, or field programmable gate arrays, software, or a combination of hardware and software.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

The terms "comprises" and/or "comprising," as used herein specify the presence of stated features, integers, steps or components but does not preclude the presence or addition of one or more other features, integers, steps, components, or groups thereof. Further, the term "exemplary" (e.g., "exemplary embodiment," "exemplary configuration," etc.) means "as an example" and does not mean "preferred," "best," or likewise.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A method for synchronizing transmissions of a plurality of faulted circuit indicators (FCIs), comprising:
    determining a time delay from a zero crossing of a power line signal;
    obtaining network information from at least one FCI from the plurality of FCIs;
    identifying a proximate FCI, which is closest to a gateway based on at least one link parameter;
    assigning the determined time delay to the proximate FCI; and
    receiving confirmations that at least one FCI received the determined time delay, and has synchronized transmissions based on the determined time delay and the zero crossings of the power signal.

2. The method of claim 1, wherein obtaining network information from the plurality of FCIs further comprises:
    transmitting a multicast request to the plurality of FCIs for an address and a hop count; and
    receiving the address and the hop count from the plurality of FCIs in response to the multicast request.

3. The method of claim 2, wherein transmitting the multicast request to the plurality of FCIs transitions at least one FCI from a power savings state to an active state.

4. The method of claim 1, wherein identifying the proximate FCI further comprises:
    determining the nearest FCI based on at least one of signal strength or time delays.

5. The method of claim 1, wherein determining the time delay comprises:
    calculating the time delay to reduce interference with the plurality of FCI transmissions caused by the power line signal.

6. A gateway, comprising:
    a communication interface;
    a memory configured to store instructions; and
    a processor, coupled to the communications interface and memory, configured to execute the instructions stored in the memory to:
        determine a time delay from a zero crossing of a power line signal,
        obtain network information from the at least one Faulted Circuit Indicator (FCI) from the plurality of FCIs,
        identify a proximate FCI, which is closest to a gateway based on at least one link parameter,
        assign the determined time delay to the proximate FCI, and
        receive confirmations that at least one FCI received the determined time delay, and has synchronized transmissions based on the determined time delay and the zero crossings of the power signal.

7. The gateway of claim 6, wherein the instructions to obtain network information from the plurality of FCIs comprises instructions configuring the processor to:
    transmit a multicast request to the plurality of FCIs for an address and a hop count; and
    receive the address and the hop count from the plurality of FCIs in response to the multicast request.

8. The gateway of claim 7, wherein the instructions to transmit the multicast request to the plurality of FCIs comprises instructions configuring the processor to transition at least one FCI from a power savings state to an active state.

9. The gateway of claim 6, wherein the instructions to identify the proximate FCI comprises instructions configuring the processor to:
    determine the nearest FCI based on at least one of signal strength or time delays.

10. The gateway of claim 6, wherein the instructions to determine the time delay comprises instructions configuring the processor to:
    calculate the time delay to reduce interference with the plurality of FCI transmissions caused by the power line signal.

11. A method to synchronize transmissions, comprising:
    receiving a request for network information from a gateway;
    transmitting network information in response to the received request;
    receiving a time delay from an adjacent fault condition indicator (FCI) or gateway;
    synchronizing transmissions according to the received time delay and a frequency based on zero crossings of a power line signal; and
    providing fault condition information over the synchronized transmissions.

12. The method of claim 11, further comprising:
transmitting a confirmation to the gateway that the time delay was received and the transmission are synchronized based on the received time delay and the zero crossings of the power line signal.

13. The method of claim 11, further comprising:
determining whether the power line signal is available; and
transmitting the fault condition information at a frequency based on the zero crossings derived from the power line signal, when it is determined that the power line signal is available.

14. The method of claim 13, wherein it is determined that the power line signal is not available, the method further comprises:
generating an internal clock signal based on the received time delay and the zero crossings of the power line signal; and
transmitting the fault condition information at a frequency derived from the internal clock signal.

15. The method of claim 11, wherein the received request for network information is a multicast request, the method further comprising:
transitioning from a power savings state to an active state; and
transmitting directly to the gateway an address and a hop count.

16. The method of claim 11, wherein providing the fault condition information over the synchronized transmissions comprises:
transmitting the fault condition information to the gateway through at least one FCI.

17. A faulted circuit indicator (FCI), comprising:
a power line sensor;
a digital interface coupled to the power line sensor;
a wireless communication interface;
a memory configured to store instructions;
a processor, coupled to the digital interface, the communications interface, and the memory, configured to execute the instructions stored in the memory to:
receive a request for network information from a gateway,
transmit network information in response to the received request,
receive a time delay from an adjacent FCI or gateway,
synchronize transmissions according to the received time delay and a frequency based on zero crossings of a power line signal, and
provide fault condition information over the synchronized transmissions; and
a backup power source coupled to the processor, the memory, the power line sensor, the digital interface, and the wireless communication interface.

18. The faulted circuit indicator of claim 17, wherein the processor is configured to:
transmit a confirmation to the gateway that the time delay was received and the transmission are synchronized based on the received time delay and the zero crossings of the power line signal.

19. The faulted circuit indicator of claim 17, wherein the processor is further configured to:
determine whether the power line signal is available; and
transmit the fault condition information at a frequency based on the zero crossings derived from the power line signal, when it is determined that the power line signal is available.

20. The faulted circuit indicator of claim 19, wherein it is determined that the power line signal is not available, the processor is configured to:
generate an internal clock signal based on the received time delay and the zero crossings of the power line signal; and
transmit the fault condition information at a frequency derived from the internal clock signal.

21. The faulted circuit indicator of claim 17, wherein the received request for network information is a multicast request, the processor is configured to:
transition from a power savings state to an active state; and
transmit directly to the gateway an address and a hop count.

22. The faulted circuit indicator of claim 17, wherein the instructions for providing the fault condition information over the synchronized transmissions comprises instructions configuring the processor to:
transmit the fault condition information to the gateway through at least one FCI.

23. The faulted circuit indicator of claim 17, wherein the wireless communications interface further comprises:
two transmitting channels and two receiving channels which may operate simultaneously, wherein each channel mitigates interference based on at least one of code division multiplexing or frequency division multiplexing.

24. The faulted circuit indicator of claim 17, wherein the processor is further configured to:
determine the presence of a transformer in the path of the transmission line, based on the timing of the received transmission;
provide an indication of the presence of the transformer to the gateway; and
receive an adjusted time delay based on the indication.

25. The faulted circuit indicator of claim 24, wherein the processor to determine the presence of a transformer in the path of the transmission line is further configured to detect a signal shift, and
wherein the processor to provide the indication of the presence of the transformer to the gateway is configured to provide the signal shift to the gateway.

* * * * *